United States Patent [19]
Wray et al.

[11] Patent Number: 5,524,285
[45] Date of Patent: Jun. 4, 1996

[54] RADIO TRANSMITTER WITH POWER AMPLIFIER AND LINEARIZATION

[76] Inventors: Anthony J. Wray, 33 Scarlatti Road, Hatch Warren; Stephen T. Valentine, 204 Britten Way, Brighton Hill, both of Basingstoke, Hants, United Kingdom, RG22 4LY; Matthew Q. Bridle, 6 Magpie Close, Kempshott, Basingstoke, Hants, United Kingdom, RG22 5GQ

[21] Appl. No.: 146,553

[22] Filed: Nov. 2, 1993

[51] Int. Cl.[6] ..................................................... H04B 1/04
[52] U.S. Cl. .......................... 455/126; 455/115; 455/116; 455/119; 330/149
[58] Field of Search ..................................... 455/126, 127, 455/115, 116, 119, 69, 70, 71, 63; 330/129, 149, 127, 279

[56] References Cited

U.S. PATENT DOCUMENTS

| | | | |
|---|---|---|---|
| 5,066,923 | 11/1991 | Gailus et al. | 330/129 |
| 5,091,919 | 2/1992 | Kuisma | 330/149 |
| 5,101,173 | 3/1992 | DiPiazza et al. | 330/279 |
| 5,123,031 | 6/1992 | Kuisma | 330/149 |
| 5,127,100 | 6/1992 | D'Amico et al. | 455/33.1 |
| 5,266,906 | 11/1993 | Inahashi | 330/149 |

OTHER PUBLICATIONS

Nagata, Yoshinori, "Linear Amplification Technique for Digital Mobile Communications", 1989, pp. 159–164.

Faulkner, Michael, Mattson, Thomas & Yates, Warren, "Adaptive Linearisation using Pre-distortion", 1990 pp. 35–40.

Primary Examiner—Reinhard J. Eisenzopf
Assistant Examiner—Doris To
Attorney, Agent, or Firm—James A. Coffing

[57] ABSTRACT

A radio transmitter includes a power amplifier (12); a linearizer (10) for maintaining linearity in the power amplifier; and a feedback path (13) for feeding a signal from an output of the power amplifier to the linearizer. The amplifier, linearizer and feedback path cooperate to form a feedback loop having adjustable loop linearization parameters (for example phase and gain). Further, a look-up table (19) is used to store predetermined loop linearization parameters and cooperates with a microprocessor having an operating condition input.

9 Claims, 4 Drawing Sheets

LINEARIZER BLOCK DIAGRAM

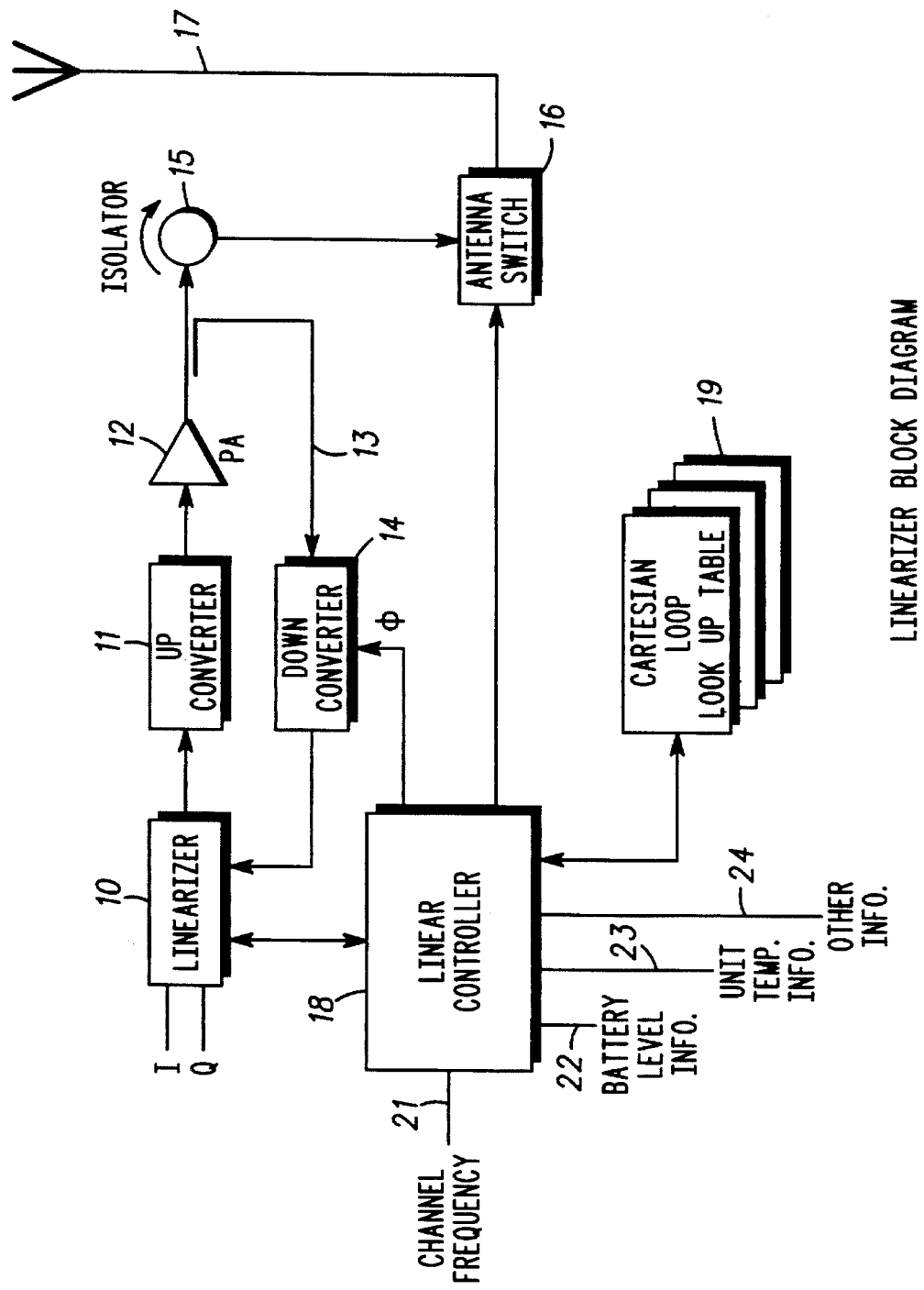

RADIO TRANSMITTER WITH POWER AMPLIFIER AND LINEARIZATION

FIELD OF THE INVENTION

This invention relates to a radio frequency power amplifier employing a linearization technique.

BACKGROUND OF THE INVENTION

Future mobile radio systems will be required to improve their spectral efficiency beyond that which currently exists today. This will mean that modulation schemes in which the information is carried in both the transmitted signal amplitude and phase will increasingly become required. In order to conserve spectrum and to coexist with current radio systems the transmitters using these complex modulations will have to be linear. For example adjacent channel interference levels of >−60 dBc in a 25 kHz channelization may be required.

SUMMARY OF THE PRIOR ART

One technique to achieve such power amplifier linearity performance is Cartesian feedback. This technique has become popular as it lends itself to integration on IC's.

The requirement for linearity (determined by adjacent channel interference limits) and maximum power efficiency, means that the power amplifier will have to operate as close to the gain compression (clip) point as possible, but still retain required level of linearity.

A known technique to measure and adjust for maximum phase margin of the closed loop system and to identify the clip point of the amplifier uses an appropriate training sequence. Gain compression is detected by an increase in the magnitude of the Cartesian loop error signal above a given threshold. At this point the drive level control circuits are set appropriately and linear operation is assured—i.e. input signal is backed off.

The above technique is only suitable in future radio products where time is available for training prior to each transmission. Time delays generally required to implement training are in the order of milliseconds. To allow this linearization technique to be implemented in systems where no training time is allocated, an alternative approach is required.

In addition to achieving linearity through training, there is a need for improved methods of maintaining linearity.

SUMMARY OF THE INVENTION

According to the invention, there is provided a radio transmitter comprising: a power amplifier; linearizing means for compensating for non-linearity in the power amplifier; and feedback means for feeding a signal from an output of the power amplifier to the linearizing means for maintaining linearity, said amplifier, linearizing means and feedback means forming a loop having adjustable loop linearization parameters; a look-up table for storing predetermined loop linearization parameters; and control means having an operating condition input, said control means being coupled to the look-up table and the loop for selecting a loop linearization parameter in response to a transmit control signal according to an operating condition input to the central means at the time of receipt of the transmit control signal.

The loop linearization parameters may be phase and/or gain parameters.

The operating condition input may be channel frequency, battery level, temperature or other information. A separate table may be stored for different values for each of these parameters. Thus, when operating at half the battery level, a table may be selected relating to that battery level.

There is preferably a temperature input receiving a signal from a temperature sensor.

The tables preferably have settings for both phase and gain parameters.

In a particularly preferred feature of the invention, the look-up table is updated by measuring the actual loop linearization parameter, selecting an improved linearization parameter and writing the improved parameter into the look-up table. In this manner, the accuracy of the look-up tables can be maintained with time. Moreover, by continuously updating the look-up tables, it is not necessary to store as extensive a range of linearization parameters for different operating conditions.

A phase setting is particularly sensitive to changes in operating conditions and the look-up tables may contain more phase parameter information than gain parameter information. In particular, if the phase margin can always be maintained at a maximum level, reduced adjacent channel splatter is observed.

For continuously measuring the phase and/or gain or other parameter of the loop, it is particularly preferred that receiver means are provided tuned to an adjacent transmitter channel for measuring modulation on the adjacent channel.

The adjacent channel receiver means may take the form of an adjacent channel receiver coupled to the output of the power amplifier and dedicated to the purpose of measuring the transmitter adjacent channel power. Alternatively, the adjacent channel receiver means may take the form of a receiver switchable between a first receive frequency which is separated from the frequency of the signal from the power amplifier by a duplex separation frequency and a second frequency which represents the frequency of a channel adjacent to that of the signal from the power amplifier.

In the latter of the above embodiments of adjacent channel receiver means, it is preferred that control means are provided for switching the receiver between a receive frequency on a receive timeslot and an adjacent channel frequency on a transmit timeslot and back to the receive frequency on a subsequent receive timeslot.

Attenuator means may be provided switchable into a path between the power amplifier and the adjacent channel receiver for attenuating the signal from the power amplifier to the adjacent channel receiver during transmission and for passing an unattenuated signal from an antenna during a receive mode of operation.

BRIEF DESCRIPTION OF THE DRAWINGS

FIG. 1 shows a block diagram of a radio transmitter with power amplifier and linearizer in accordance with a first embodiment of the invention.

DETAILED DESCRIPTIONS OF THE PREFERRED EMBODIMENTS

Figure 2A:
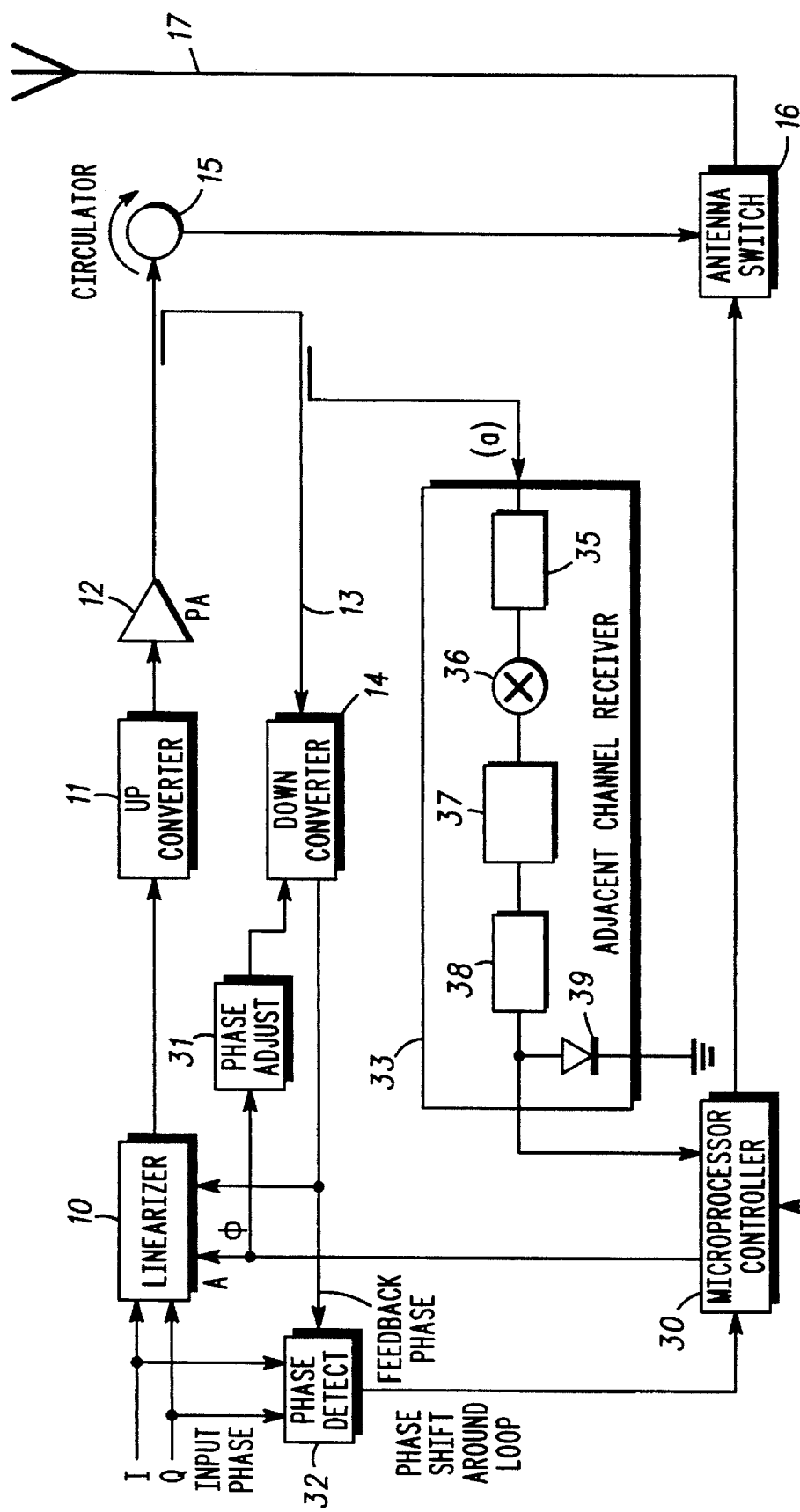
FIGS. 2a and 2b show block diagrams of radio transmitters with power amplifiers and linearizers in accordance with second and third embodiments of the invention.

Referring to FIG. 1, there is shown a radio transmitter comprising a linearizer 10, an upconverter 11, a power amplifier 12, a feedback path 13, and a downconverter 14. The linearizer 10, upconverter 11, power amplifier 12, feedback path 13 and downconverter 14 form a feedback loop. The output of the power amplifier 12 is connected via an isolator 15 and an antenna switch 16 to an antenna 17. A linear controller 18 is provided and connected to the linearizer 10, the downconverter 14 and the antenna switch 16. Connected to the linear controller 18 is a series of look-up tables in memory 19. The linear controller 18 has a number of inputs of which a channel/frequency input 21, a battery level input 22, a unit temperature input 23 and other information inputs 24 are shown.

On accepting a request for transmission from a push-to-talk (PTT) switch (not shown) or otherwise, the transmitter power amplifier 12 is turned on. The various operating parameter inputs 21, 22 and 23 are measured by the controller 18 and a look-up table 19 is selected for the measured conditions. Thus, for a particular channel, battery level and measured temperature (as indicated by a temperature sensor), predetermined gain and phase settings will be downloaded from the look-up table 19.

The linearizer phase shift and drive level attenuator settings, which are described in more detail in the paper "Transmitter Linearization using Cartesian Feedback for Linear TDMA Modulation" by M. Johansson and T. Mattsson 1991, IEEE are set in the downconverter 14 and the linearizer 10 respectively by the linear controller 18 depending on the values read from the look-up table 19. The antenna switch 16 is at this point operated using an appropriately controlled ramp signal, having a raised cosine profile, to avoid excess splatter to adjacent channels. Transmission of the information (data or voice) defined by I and Q samples input to the linearizer 10 now takes place in a stable linear operation.

The values in the look-up table 19 are set in the factory by extensive testing at different temperatures battery levels, etc.

In a more preferred embodiment of the invention, the values in the look-up table are updated as the radio is used.

For a given transmission request, the loop phase and gain parameters read from the look-up table 19 are those set in the look-up table from a previous transmission on the channel in question at the battery level and temperature in question. When these values have been loaded into the linearizer 10 and transmission begins, a comparison is made between the I and Q values input and those received on the feedback path 13 from the downconverter 14. Based on a comparison of these values, a decision is made as to the need for updating the loop phase and gain parameters. If, for example, the phase margin has decreased, a new phase setting is calculated to increase the phase margin for the loop. This new phase setting is now written into the particular location in the look-up table 19 for the current channel, battery level and temperature settings and replaces the previously existing value. The new value will be used next time a transmission is requested on that channel at that battery level and at that temperature.

An assumption is made that changes in loop phase and gain characteristics due to battery voltage and temperature are independent of one another. This allows separate look-up tables to be used for different battery voltage settings and temperature settings. It is found that this is a workable assumption, however, more extensive look-up tables can be stored for particular battery level and temperature pairs. The memory 19 can be arranged in other formats.

Interpollation may be carried out between values, e.g. values for measurements at two temperature when the temperature sensor senses an intermediate temperature.

To allow for the linearizer adjustment, the ramp signal to the antenna switch is delayed by an appropriate amount $\Delta t$; this is to compensate for the look-up table access time and downloaded to the linearizer circuitry. This delay is assumed to be minimal in comparison with the ramp time of the antenna switch. Therefore when the antenna is connected to the power amplifier output, the power amplifier is operating at the correct level to ensure compliance with required interference specifications.

As an alternative to sensing of loop gain and phase settings and refreshing the look-up table entries after each transmission, a retraining sequence can be input to the linearizer 10 and transmitted out of the antenna 17, or into a load as described in co pending UK patent application No. 9202296 entitled "Radio Transmitter with Linearization Training Sequence" filed on the same date as the application from which the present application claims priority, or transmitted into an adjacent channel receiver as is described below.

The sensing of loop gain and phase settings and refreshing of the look-up table entries after each transmission does not incur a time penalty and allows the transmitter to be available at all times. The values in the tables can be refreshed when a measured value deviates from a stored value by more than the predetermined amount, or they can be refreshed at regular intervals.

If retraining is used, this can be implemented by refreshing the look-up table entries on every power-up of the radio, by refreshing the look-up table entries at fixed intervals of operation in terms of absolute time or transmission time, or refreshing the look-up table entries at intervals dictated by radio transmitter conditions.

Loop phase and drive level settings are monitored and adjusted during transmission to take into account changing device characteristics and the linearized power amplifier is optimized for both stability and efficiency. The transmitter efficiency is maximized by operating the power amplifier as close to its gain compression point as possible, as described in U.S. patent application Ser. No. 606679 of Motorola Inc, annexed hereto as "Annex 1" The transmitter, however, is restricted by the amount of adjacent channel interference it should be allowed to generate. For maximum efficiency the transmitter must operate as close to the adjacent channel interference limit as possible. It would be desirable to provide an improved means for performing a "clip detect" operation to find the optimum setting of loop gain for the feedback network.

An arrangement is shown in FIG. 2 which meets the above need and comprises a number of elements already described with reference to FIG. 1. In FIG. 2a, there is shown a microprocessor 30 which controls the gain (A) and phase ($\phi$) of the feedback loop. In FIG. 2a, a phase adjuster 31 is shown separate to the linearizer 10, as is a feedback phase detector 32. It will be appreciated that these elements are present in the circuit of FIG. 1, but are merely encompassed within the linearizer block 10 of FIG. 1.

Figure 2B:
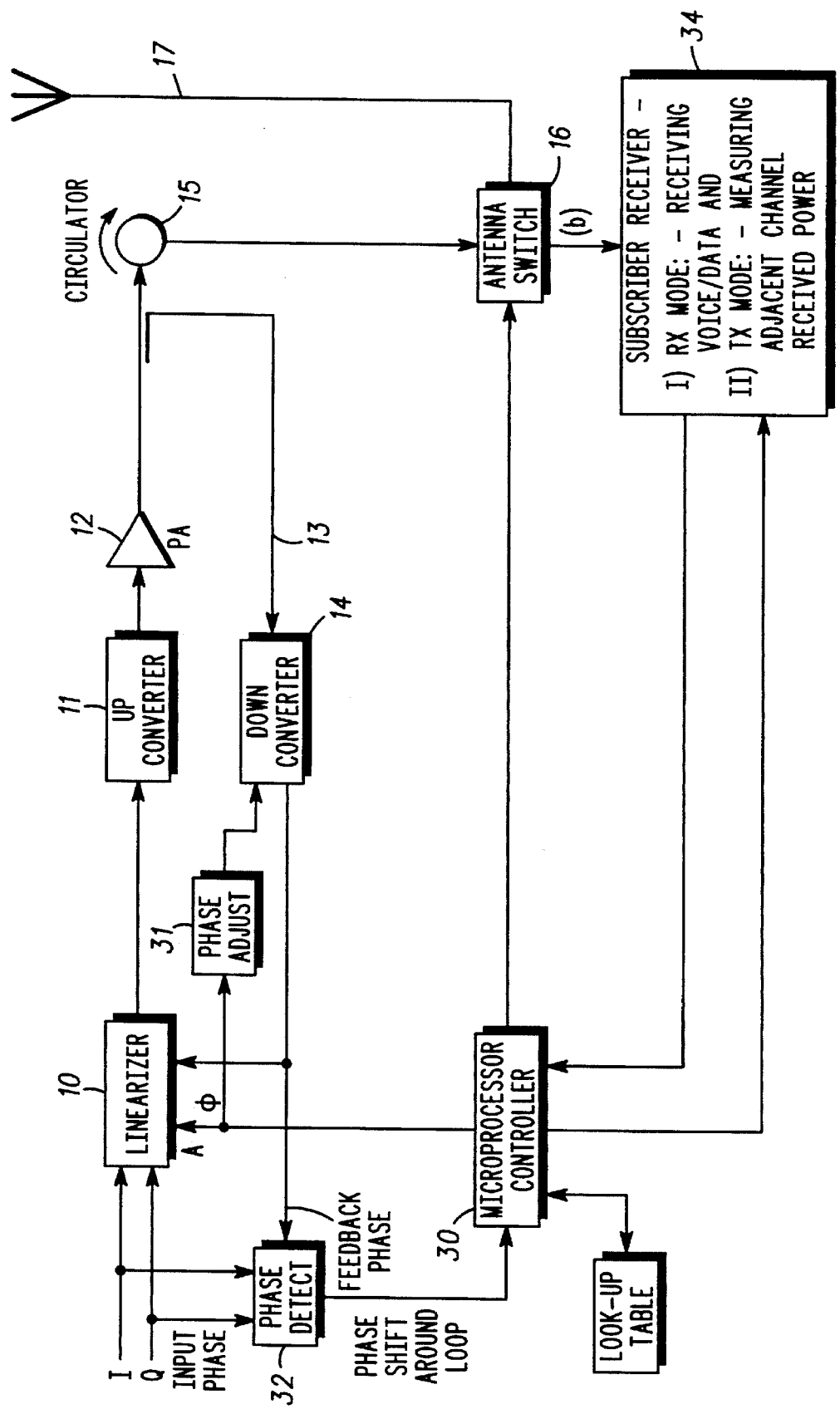

In addition to the above elements, the circuit of FIG. 2a has an adjacent channel receiver 33, or in a further embodiment shown in FIG. 2b, as an alternative to adjacent channel receiver 33, a subscriber receiver 34 is provided with a control input from microprocessor 30 for changing the receive frequency of the subscriber receiver 34 from a receive mode (for receiving voice/data from the antenna 17) to an adjacent channel receive mode for measuring adjacent channel receive power.

Referring to the first of these alternative embodiments, the adjacent channel receiver 33 is connected to the output of the power amplifier 12 and comprises an attenuator 35, a downconverter to a suitable IF frequency, (a mixer 36 which taps a signal from a main synthesizer for the radio), an IF filter 37, an attenuator 38, a rectifier 39 and means for measuring voltage across the rectifier. A ceramic filter is suitable for the IF filter. This ceramic filter is a 25 KHz bandpass filter tuned to a frequency 25 KHz offset from the IF signal for the corresponding transmit channel.

Figure 4:
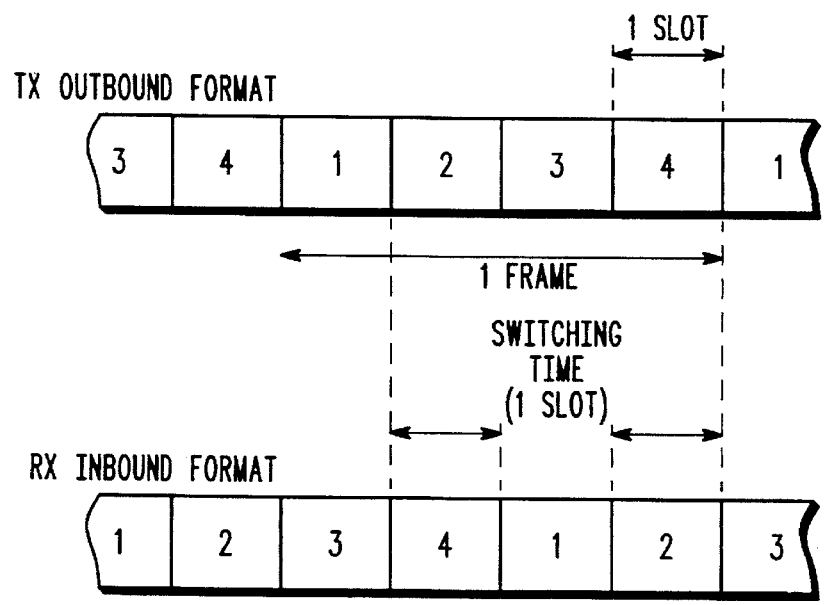
FIG. 4 shows a TDMA timing format in which the invention may be employed.

In the second embodiment shown in FIG. 2b in which the subscriber receiver 34 changes between a receive mode and an adjacent channel receive mode, operation will be described with reference to a TDMA system having 60 millisecond frames divided into 4 timeslots of 15 milliseconds each as shown in FIG. 4. A transmit frame is always offset from a receive frame and vice versa. A channel pair may comprise the first timeslot of the transmit frame and the first timeslot of the receive frame or the second timeslot of the transmit frame and the second timeslot of the receive frame etc. There will always be about 15 milliseconds between the end of a transmit timeslot and the beginning of a receive timeslot. This provides ample time for the microprocessor 30 to provide a control signal to the synthesizer of the subscriber receiver 34 to cause a receive frequency change equal to the duplex frequency separation between the transmission receive frequencies less (or in addition to) an amount equal to the channel spacing. Where the duplex frequency separation is 10 MHz, and the channel separation is 25 KHz, the signal from the microprocessor causes the receiver 34 to change its receive frequency through 9.975 MHz or 10.025 MHz. After a receive frame, the receiver 34 changes its frequency to be adjacent that of the signal being transmitted from power amplifier 12 in a transmit frame and, after transmission, it switches back to its appropriate receive frequency for receiving the next timeslot from the antenna 17.

While the adjacent channel receiver 33 or the re-tuned subscriber receiver 34 is tuned to the adjacent channel, it is able to measure the power on the adjacent channel. If the level of signal on the adjacent channel exceeds a threshold, for example a threshold of 60 or 63 dB below the output level of the power amplifier 12, this is an indication of onset of clipping in the power amplifier 12 and an indication that it is necessary to back off the gain of the power amplifier 12. Thus, the adjacent channel receiver 33 or the subscriber receiver 34 provides a signal to the microprocessor 30 from which, if onset of clipping is detected, controls the linearizer 10 to reduce the gain A.

As a result, with a real-time knowledge of the splatter to adjacent channel power, backing off made to the drive level to the power amplifier can be minimized at all times ensuring true, optimum operating efficiency. In addition, the arrangement ensures a predetermined maximum splatter into the adjacent channel at all times.

On detecting of clipping and backing off of the power amplifier, the new value for the loop gain (a) can be loaded into the look-up tables of FIG. 1.

The adjacent channel receiver of 33 or subscriber receiver 34 can be used for detecting "clip" during a training sequence such as that described in U.S. Pat. No. 5,066,923 of Motorola Inc. During the training sequence, the energy of the power amplifier is diverted into the adjacent channel receiver 33 or the subscriber receiver 34 by isolation of the antenna 17 using the antenna switch 16. This allows the energy to be directed away from the antenna ensuring "off-air" training and no on-air adjacent channel splatter. It is proposed that this transmit energy whilst training is diverted into the appropriate receiver by the microprocessor 30 controlling the antenna switch 16. This can be achieved by:

(1) coupling of some of the feedback signal power into a separate receiver tuned to the adjacent channel or (2) short circuiting the antenna switch into the subscriber unit receiver and switching the down-converter local oscillator frequency by the duplex separation frequency plus or minus the channel bandwidth, therefore allowing the standard receiver to perform a received signal strength indication on the adjacent transmit channel.

Figure 3:
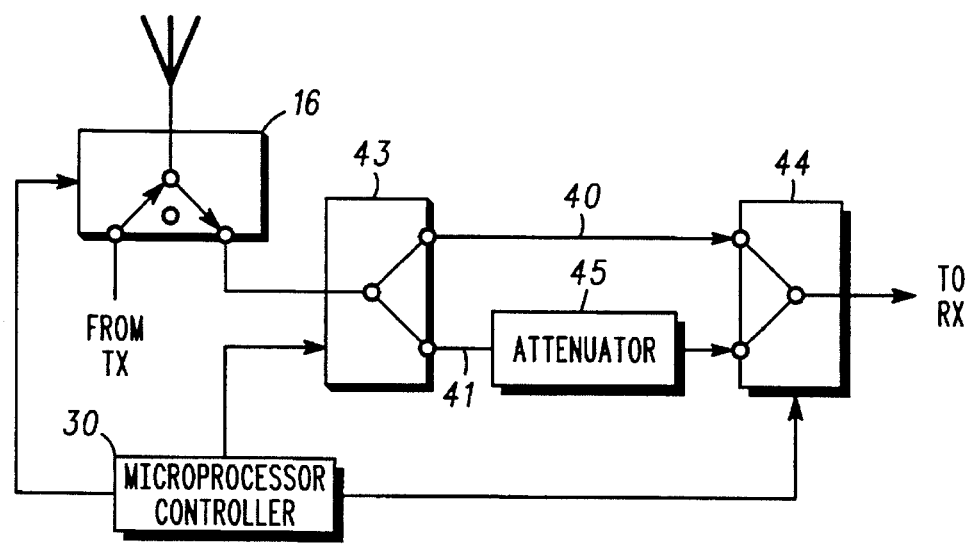
FIG. 3 shows switched attenuator circuit for switching into the circuit of FIG. 2b at point (b).

In the case of a short circuited implementation, suitable attenuation of the transmitter power is required to avoid over driving the receiver. This is implemented by appropriate switching of receiver paths 40 and 41 as shown in FIG. 3. Receiver path 40 provides a path from the antenna 17 to the receiver 34. Adjacent channel receive path 41 provides a path in the case of routing of the signal from the power amplifier 12 to the receiver 34. The circuit comprises three pin diode switches 16, 43 and 44 under control of the microprocessor 30. An attenuator 45 is provided in the adjacent channel receive path 41, having a suitable value to avoid overdriving the receiver circuitry. The operation is as follows. Simultaneously with the switching of the antenna switch 16 by the microprocessor controller 30, the controller 30 causes pin diode switches 43 and 44 to switch from path 40 to path 41, thus switching attenuator 45 into the path to protect the receiver. The timing can be arranged such that attenuator 45 is always switched into the path before antenna switch 16 switches The measurement of the adjacent channel power in the adjacent channel receiver can be accomplished by any of the standard methods available. One of which is to use an FFT of the received signal, and then processing this data to obtain a measurement of the adjacent channel power. The generation of the transmit spectrum has the advantage over the previously described method of using a separate adjacent channel receiver for measuring the adjacent channel power as it is able to monitor both adjacent channels simultaneously.

The invention also allows a method of real-time monitoring of the phase shift around the feedback loop, thus allowing the loop phase to be adjusted whenever required, ensuring stability at all times. This technique can be utilized to reduce the phase margin normally designed into such feedback systems, therefore creating an opportunity to increase the loop gain and consequently improve the intermodulation performance that is attainable by significant amount.

It is proposed that some of the feed-back signal is routed into a phase detector, which then transmits the phase information of the feed-back signal to the microprocessor. This phase measurement can then be compared against the phase of the transmitted signal (which is also measured). Any transmit data is suitable for use with this phase comparison. It is suggested that for continuous operation mode within current TDMA frame structures, that measuring the phase shift of the synchronization word is a good option.

Phase shift measurement during the synchronization word is carried out at the beginning of a timeslot when the synchronization work is transmitted in terms of predetermined I and Q samples being input to linearizer 10. These predetermined I and Q samples can be used for comparison with the corresponding samples measured by downconverter 14. Thus, the phase shift measurement is carried out during transmission of the synchronization word.

The overall arrangement described provides the advantages of:

(1) providing a method of "clip detection" by measuring the splattered power transmitted into the adjacent channel as part of a training process or as a real-time measurement of the intermodulation performance of the loop:

(2) providing an alternative method of measuring the phase shift around the feedback loop during continuous operation and during a training process and (3) maximizing the operating efficiency of the power amplifier by operating as close as possible to its saturation level whilst maintaining a satisfactory intermodulation ratio performance.

Instead of using Cartesian feedback, predistortion feedback can be used as described in the paper "Linear Amplification Technique for Digital Mark Communications" by Yoshinori Nagata 1989 IEEE. In this case parameters other than gain and phase will be stored in the look-up table. Instead, I and Q sample predistortion factors or parameters will be stored.

I claim:

1. A radio transmitter responsive to a transmit control signal comprising:

a power amplifier for providing a transmit radio signal at an output;

a linearizer that compensates for non-linearity in the power amplifier;

a feedback path having an input coupled to the output of the power amplifier and an output coupled to the linearizer for feeding a portion of the transmit radio signal from the output of the power amplifier to the linearizer, said power amplifier, linearizer and feedback path forming a loop having adjustable loop linearization parameters;

a look-up table having predetermined loop linearization parameters stored therein; and a controller having an operating condition input, said controller being coupled to the look-up table and the loop for selecting a loop linearization parameter in response to the transmit control signal according to the operating condition input to the controller at the time of receipt of the transmit control signal.

2. A radio transmitter according to claim 1, wherein the operating condition input is at least one of a frequency, a battery level and a temperature input.

3. A radio transmitter responsive to a transmit control signal comprising:

a power amplifier for providing a transmit radio signal at an output;

a linearizer that compensates for non-linearity in the power amplifier;

a feedback path having an input coupled to the output of the power amplifier and an output coupled to the linearizer for feeding a portion of the transmit radio signal from the output of the power amplifier to the linearizer, said power amplifier, linearizer and feedback path forming a loop having adjustable loop linearization parameters;

a look-up table having predetermined loop linearization parameters stored therein;

a controller having an operating condition input, said controller being coupled to the look-up table and the loop for selecting a loop linearization parameter in response to the transmit control signal according to the operating condition input to the controller at the time of receipt of the transmit control signal; and a radio receiver tuned to an adjacent transmit channel for monitoring the loop linearization parameter by measuring signals on the adjacent channel originating from the power amplifier.

4. A radio transmitter according to claim 3, wherein the radio receiver includes a receiver switchable between a first receive frequency which is separated from the frequency of the signal from the power amplifier by a duplex separation frequency and a second frequency which represents the frequency of a channel adjacent that of the signal from the power amplifier.

5. A radio transmitter according to claim 4 wherein said controller switches the receiver between a receive frequency on a receive timeslot and an adjacent channel frequency on a transmit timeslot and back to the receive frequency on a subsequent receive timeslot.

6. A radio transmitter according to claim 4 further comprising a signal attenuator that is switchable into a path between the power amplifier and the receiver for attenuating the signal from the power amplifier to the receiver during transmission and for passing an unattenuated signal from the antenna during a receive mode of operation.

7. A radio transmitter according to claim 3, wherein said controller inputs a training sequence into the linearizer and monitors an actual loop linearization parameter for the loop in response to the training sequence, for performing a comparison of the actual loop linearization parameter with the loop linearization parameter selected and for selecting an improved linearization parameter in response to the comparison.

8. A radio transmitter circuit comprising:

a power amplifier coupled to an antenna for transmission of radio signals on a transmit channel;

a linearizer that compensates for non-linearity in the power amplifier;

a microprocessor for outputting a training sequence to the power amplifier;

a feedback circuit for feeding the training sequence output from the power amplifier back to the linearizer to adjust the linearizer;

an adjacent channel receiver tuned to a channel adjacent the transmit channel for measuring signals from the power amplifier appearing on the adjacent channel, wherein the microprocessor adjusts the linearizer in response to signals measured on the adjacent channel while the training sequence is output from the power amplifier.

9. A radio transmitter circuit comprising:

a power amplifier coupled to an antenna for transmission of radio signals on a transmit channel;

a linearizer for compensating for non-linearity in the power amplifier, wherein the linearizer is responsive to signals measured on the adjacent channel while a training sequence is output from the power amplifier;

a microprocessor that outputs a synchronization sequence to the power amplifier for providing timing information to a receiving radio where the synchronization sequence is also used as a training sequence for linearization of the linearizer;

a feedback path that feeds the training sequence output from the power amplifier back to the linearizer to adjust the linearizer;

an adjacent channel receiver, tuned to a channel adjacent the transmit channel, that measures signals from the power amplifier appearing on the adjacent channel; and a transmitter that transmits the synchronization sequence for providing timing information to a receiving radio;

wherein the microprocessor is responsive to the adjacent channel receiver for adjusting the linearizer in response to signals measured on the adjacent channel and for training the linearizer to the synchronization sequence while the synchronization sequence is output from the power amplifier.

* * * * *